(12) United States Patent
Marrow et al.

(10) Patent No.: US 11,016,681 B1
(45) Date of Patent: May 25, 2021

(54) MULTI-THRESHOLD PARAMETER ADAPTATION

(71) Applicant: Seagate Technology LLC, Cupertino, CA (US)

(72) Inventors: Marcus Marrow, San Jose, CA (US); Jason Bellorado, San Jose, CA (US); Vincent Brendan Ashe, San Jose, CA (US); Zheng Wu, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 26 days.

(21) Appl. No.: 16/051,244

(22) Filed: Jul. 31, 2018

(51) Int. Cl.
*G06F 3/06* (2006.01)
*H03M 13/41* (2006.01)
*G06F 11/10* (2006.01)

(52) U.S. Cl.
CPC .......... *G06F 3/0632* (2013.01); *G06F 3/0619* (2013.01); *G06F 3/0676* (2013.01); *G06F 11/1076* (2013.01); *H03M 13/4146* (2013.01)

(58) Field of Classification Search
CPC .... G06F 3/0632; G06F 3/0619; G06F 3/0676; G06F 11/1076; H03M 13/4146
USPC ..... 714/795, 704, 6.22, 47.2, 769–771, 773, 714/774; 360/31
See application file for complete search history.

(56) References Cited

U.S. PATENT DOCUMENTS

| | | |
|---|---|---|
| 5,321,564 A | 6/1994 | Takahashi |
| 5,461,644 A * | 10/1995 | Bergmans ......... H03M 13/6502 375/341 |
| 5,543,978 A | 8/1996 | Park |
| 5,621,769 A * | 4/1997 | Wan ..................... H04B 7/0851 375/341 |
| 5,654,765 A | 8/1997 | Kim |
| 5,742,532 A | 4/1998 | Duyne et al. |
| 5,862,192 A * | 1/1999 | Huszar ................. H03M 13/25 375/262 |
| 5,970,093 A | 10/1999 | Lantremange |
| 6,111,712 A | 8/2000 | Vishakhadatta et al. |
| 6,157,510 A | 12/2000 | Schreck et al. |
| 6,181,213 B1 | 1/2001 | Chang |
| 6,222,592 B1 | 4/2001 | Patel |

(Continued)

OTHER PUBLICATIONS

Maruf Mohammad, Blind Acquisition of Short Burst with Per-Survivor Processing (PSP), Nov. 26, 2002, Virginia Polytechnic Institute & State University, pp. 1-127. (Year: 2002).*

(Continued)

*Primary Examiner* — John J Tabone, Jr.
(74) *Attorney, Agent, or Firm* — Kirk A. Cesari

(57) ABSTRACT

An apparatus may include a circuit configured to receive an input signal at an input and process the input signal using a set of channel parameters. The circuit may further determine an error metric for the processing of the input signal using the set of channel parameters, compare the error metric to a plurality of thresholds, and when the error metric matches one of the plurality of thresholds, adapt, using an adaptation algorithm, the set of channel parameters to produce an updated set of channel parameters for use by the circuit as the set of channel parameters in subsequent processing of the input signal, the adaptation of the set of channel parameters being based on a weight corresponding to the matching threshold of the plurality of thresholds.

19 Claims, 4 Drawing Sheets

(56) References Cited

U.S. PATENT DOCUMENTS

| | | | |
|---|---|---|---|
| 6,320,920 B1 | 11/2001 | Beyke | |
| 6,377,552 B1 | 4/2002 | Moran et al. | |
| 6,396,887 B1 | 5/2002 | Ware et al. | |
| 6,438,185 B1* | 8/2002 | Huttunen | H04L 25/03292 375/232 |
| 6,505,222 B1 | 1/2003 | Davis et al. | |
| 6,519,107 B1 | 2/2003 | Ehrlich et al. | |
| 6,549,587 B1 | 4/2003 | Li | |
| 6,580,676 B1 | 6/2003 | Yanagisawa et al. | |
| 6,581,182 B1* | 6/2003 | Lee | H03M 13/29 375/262 |
| 6,633,894 B1 | 10/2003 | Cole | |
| 6,665,308 B1 | 12/2003 | Rakib et al. | |
| 6,687,073 B1 | 2/2004 | Kupferman | |
| 6,697,891 B2 | 2/2004 | Emberty et al. | |
| 6,707,772 B1 | 3/2004 | Marrec et al. | |
| 6,738,205 B1 | 5/2004 | Moran et al. | |
| 6,738,215 B2 | 5/2004 | Yatsu | |
| 6,950,258 B2 | 9/2005 | Takaishi | |
| 6,993,291 B2 | 1/2006 | Parssinen et al. | |
| 7,046,701 B2 | 5/2006 | Mohseni et al. | |
| 7,085,330 B1 | 8/2006 | Shirali | |
| 7,133,233 B1 | 11/2006 | Ray et al. | |
| 7,133,239 B1 | 11/2006 | Hartman et al. | |
| 7,245,448 B2 | 7/2007 | Urata | |
| 7,298,573 B2 | 11/2007 | Kitamura | |
| 7,324,437 B1 | 1/2008 | Czylwik et al. | |
| 7,362,432 B2 | 4/2008 | Roth | |
| 7,440,208 B1* | 10/2008 | McEwen | G11B 20/10009 360/31 |
| 7,929,238 B1 | 4/2011 | Vasquez | |
| 7,940,667 B1 | 5/2011 | Coady et al. | |
| 7,948,703 B1 | 5/2011 | Yang | |
| 8,027,117 B1 | 9/2011 | Sutardja et al. | |
| 8,139,301 B1 | 3/2012 | Li et al. | |
| 8,160,181 B1* | 4/2012 | Song | H04B 1/16 375/229 |
| 8,172,755 B2 | 5/2012 | Song et al. | |
| 8,296,637 B1* | 10/2012 | Varnica | H03M 13/1102 714/794 |
| 8,400,726 B1 | 3/2013 | Wu et al. | |
| 8,456,977 B2 | 6/2013 | Honma | |
| 8,479,086 B2 | 7/2013 | Xia et al. | |
| 8,514,506 B1 | 8/2013 | Li et al. | |
| 8,539,328 B2 | 9/2013 | Jin et al. | |
| 8,542,766 B2 | 9/2013 | Chekhovstov et al. | |
| 8,543,894 B1* | 9/2013 | Varnica | H03M 13/1102 714/794 |
| 8,713,413 B1 | 4/2014 | Bellorado et al. | |
| 8,724,245 B1 | 5/2014 | Smith et al. | |
| 8,755,139 B1 | 6/2014 | Zou et al. | |
| 8,760,794 B1 | 6/2014 | Coker et al. | |
| 8,767,341 B1 | 7/2014 | Coker et al. | |
| 8,780,477 B1 | 7/2014 | Guo et al. | |
| 8,837,068 B1 | 9/2014 | Liao et al. | |
| 8,861,111 B1 | 10/2014 | Liao et al. | |
| 8,861,112 B1 | 10/2014 | Pan et al. | |
| 8,887,033 B1* | 11/2014 | Varnica | H03M 13/1102 714/718 |
| 8,953,276 B1 | 2/2015 | Pokharel et al. | |
| 9,007,707 B1 | 4/2015 | Lu et al. | |
| 9,019,642 B1 | 4/2015 | Xia et al. | |
| 9,025,269 B1 | 5/2015 | Wong et al. | |
| 9,064,537 B1 | 6/2015 | Nie et al. | |
| 9,082,418 B2 | 7/2015 | Ong et al. | |
| 9,093,115 B1 | 7/2015 | Fung et al. | |
| 9,099,132 B1 | 8/2015 | Grundvig et al. | |
| 9,129,650 B2 | 9/2015 | Mathew et al. | |
| 9,147,416 B2 | 9/2015 | Grundvig et al. | |
| 9,189,315 B1* | 11/2015 | Varnica | H03M 13/1102 |
| 9,196,298 B1 | 11/2015 | Zhang et al. | |
| 9,245,578 B1 | 1/2016 | Wang et al. | |
| 9,245,579 B2 | 1/2016 | Song et al. | |
| 9,245,580 B1 | 1/2016 | Lu et al. | |
| 9,246,668 B1 | 1/2016 | Yu et al. | |
| 9,257,135 B2 | 2/2016 | Ong et al. | |
| 9,257,145 B1 | 2/2016 | Soderbloom et al. | |
| 9,286,915 B1 | 3/2016 | Dziak et al. | |
| 9,311,937 B2 | 4/2016 | Zou et al. | |
| 9,311,959 B1* | 4/2016 | Fan | G11B 20/18 |
| 9,385,757 B1* | 7/2016 | Nangare | H03M 13/256 |
| 9,401,161 B1 | 7/2016 | Jury et al. | |
| 9,424,878 B1 | 8/2016 | Dziak et al. | |
| 9,431,052 B2 | 8/2016 | Oberg et al. | |
| 9,489,976 B2* | 11/2016 | Jury | G11B 20/10046 |
| 9,508,369 B2 | 11/2016 | Chu et al. | |
| 9,536,563 B1* | 1/2017 | Liu | G11B 20/1879 |
| 9,542,972 B1 | 1/2017 | Nayak et al. | |
| 9,564,157 B1 | 2/2017 | Trantham | |
| 9,590,803 B2 | 3/2017 | Derras et al. | |
| 9,645,763 B2* | 5/2017 | Sankaranarayanan | G06F 3/0653 |
| 9,672,850 B2 | 6/2017 | Grundvig et al. | |
| 9,728,221 B2 | 8/2017 | Oberg et al. | |
| 9,819,456 B1 | 11/2017 | Bellorado et al. | |
| 9,947,362 B1 | 4/2018 | Venkataramani et al. | |
| 9,998,136 B1 | 6/2018 | Wu | |
| 10,014,026 B1 | 7/2018 | Wu et al. | |
| 10,164,760 B1 | 12/2018 | Bellorado et al. | |
| 10,177,771 B1 | 1/2019 | Bellorado et al. | |
| 10,180,868 B2* | 1/2019 | Alhussien | G06F 11/076 |
| 10,276,233 B1* | 4/2019 | Danjean | G11C 11/5642 |
| 10,297,281 B1* | 5/2019 | Bellorado | G11B 5/59688 |
| 10,469,290 B1* | 11/2019 | Marrow | H03L 7/091 |
| 10,498,565 B1 | 12/2019 | Azenkot et al. | |
| 2002/0080898 A1 | 6/2002 | Agazzi et al. | |
| 2002/0181439 A1 | 12/2002 | Orihashi et al. | |
| 2003/0185114 A1 | 10/2003 | Liaw | |
| 2003/0198152 A1 | 10/2003 | Morishima | |
| 2003/0198165 A1 | 10/2003 | Mouri et al. | |
| 2004/0101068 A1 | 5/2004 | Wang et al. | |
| 2004/0228397 A1 | 11/2004 | Bach | |
| 2005/0117243 A1 | 6/2005 | Serizawa | |
| 2005/0270687 A1 | 12/2005 | Zweighaft | |
| 2006/0215290 A1* | 9/2006 | Kurtas | G11B 20/10101 360/31 |
| 2007/0139805 A1 | 6/2007 | Mead | |
| 2007/0139806 A1 | 6/2007 | Southerland et al. | |
| 2007/0177292 A1 | 8/2007 | Bui et al. | |
| 2008/0007855 A1 | 1/2008 | Vityaev et al. | |
| 2008/0158711 A1 | 7/2008 | Bliss et al. | |
| 2008/0175309 A1 | 7/2008 | Fimoff et al. | |
| 2009/0028252 A1 | 1/2009 | Lu | |
| 2009/0097606 A1 | 4/2009 | Hutchins et al. | |
| 2009/0141386 A1 | 6/2009 | Miura | |
| 2009/0262870 A1* | 10/2009 | Ashbrook | H04B 10/2507 375/341 |
| 2009/0323214 A1 | 12/2009 | Grundvig et al. | |
| 2010/0290153 A1 | 11/2010 | Hampshire | |
| 2011/0002375 A1 | 1/2011 | Honma | |
| 2011/0072335 A1* | 3/2011 | Liu | H03M 13/1102 714/796 |
| 2011/0090773 A1 | 4/2011 | Yu et al. | |
| 2011/0176400 A1 | 7/2011 | Gerasimov | |
| 2012/0082018 A1 | 4/2012 | Gushima et al. | |
| 2012/0105994 A1 | 5/2012 | Bellorado et al. | |
| 2012/0155577 A1 | 6/2012 | Shukla et al. | |
| 2013/0076433 A1 | 3/2013 | Fratti | |
| 2013/0201838 A1* | 8/2013 | Homchaudhuri | H04W 52/0245 370/242 |
| 2014/0009192 A1 | 1/2014 | Suzuki | |
| 2014/0035638 A1 | 2/2014 | Bode | |
| 2014/0223114 A1 | 8/2014 | Wang et al. | |
| 2015/0003221 A1 | 1/2015 | Sankaranarayanan et al. | |
| 2015/0022916 A1 | 1/2015 | Zou et al. | |
| 2015/0279398 A1 | 10/2015 | Fan et al. | |
| 2015/0355838 A1 | 12/2015 | Chen et al. | |
| 2015/0380048 A1 | 12/2015 | Oberg et al. | |
| 2016/0019921 A1 | 1/2016 | Bui et al. | |
| 2016/0112218 A1 | 4/2016 | Abe | |
| 2016/0293205 A1* | 10/2016 | Jury | G11B 20/10046 |
| 2016/0351227 A1 | 12/2016 | Koshino | |

(56) References Cited

U.S. PATENT DOCUMENTS

| | | | |
|---|---|---|---|
| 2017/0125089 A1* | 5/2017 | Sankaranarayanan | ........................ G11C 11/5642 |
| 2017/0125110 A1* | 5/2017 | Sankaranarayanan | ........................ G11C 16/26 |
| 2017/0236592 A1* | 8/2017 | Alhussien | ........ G11C 29/50004 714/721 |
| 2017/0249206 A1* | 8/2017 | Jeong | .................. G06F 11/0793 |
| 2018/0011753 A1* | 1/2018 | Alhussien | .............. G11C 16/28 |
| 2018/0012663 A1* | 1/2018 | Alhussien | .............. G11C 29/52 |
| 2018/0277158 A1 | 9/2018 | Kishino | |
| 2018/0367164 A1* | 12/2018 | Marrow | .................. H03L 7/091 |
| 2019/0130967 A1* | 5/2019 | Danjean | .............. G11C 11/5642 |
| 2020/0065262 A1 | 2/2020 | Bellorado | |

OTHER PUBLICATIONS

James Hicks, Overloaded Array Processing with Spatially Reduced Search Joint Detection, May 10, 2000, Virginia Polytechnic Institute & State University, pp. 1-144. (Year: 2000).*

Yuanbin Guo, An Efficient CirculantMIMO Equalizer for CDMA Downlink: Algorithm and VLSI Architecture, 2006, Hindawi Publishing Corporation, pp. 1-18. (Year: 2006).*

Nechaev, Y. B., et al., "Increasing Efficiency of Information Transmission with Interference Influence by the Use of Multi-Parameter Adaptation", East-West Design & Test Symposium (EWDTS 2013), Rostov-on-Don, 2013, pp. 1-4 (Year: 2013).

* cited by examiner

MULTI-THRESHOLD PARAMETER ADAPTATION

SUMMARY

In certain embodiments, an apparatus may include a circuit configured to receive an input signal at an input and process the input signal using a set of channel parameters. The circuit may further determine an error metric for the processing of the input signal using the set of channel parameters, compare the error metric to a plurality of thresholds, and when the error metric matches one of the plurality of thresholds, adapt, using an adaptation algorithm, the set of channel parameters to produce an updated set of channel parameters for use by the circuit as the set of channel parameters in subsequent processing of the input signal, the adaptation of the set of channel parameters being based on a weight corresponding to the matching threshold of the plurality of thresholds.

In certain embodiments, a system may include an input configured to receive an input signal and a channel circuit configured to process the input signal using a set of parameters. The system may further include an adaptation circuit configured to determine an error metric for the processing of the input signal using the set of channel parameters, compare the error metric to a plurality of thresholds, and when the error metric matches one of the plurality of thresholds, adapt, using an adaptation algorithm, the set of channel parameters to produce an updated set of channel parameters for use by the circuit as the set of channel parameters in subsequent processing of the input signal, the adaptation of the set of channel parameters being based on a weight corresponding to the matching threshold of the plurality of thresholds.

In certain embodiments, a method may include receiving, at an input of a circuit, an input signal and processing, by the circuit, the input signal using a set of channel parameters. The method may further include determining, by the circuit, an error metric for the processing of the input signal using the set of channel parameters, comparing, by the circuit, the error metric to a plurality of thresholds; and when the error metric matches one of the plurality of thresholds, adapting, by the circuit using an adaptation algorithm, the set of channel parameters to produce an updated set of channel parameters for use by the circuit as the set of channel parameters in subsequent processing of the input signal, the adaptation of the set of channel parameters being based on a weight corresponding to the matching threshold of the plurality of thresholds.

DETAILED DESCRIPTION

Figure 1:
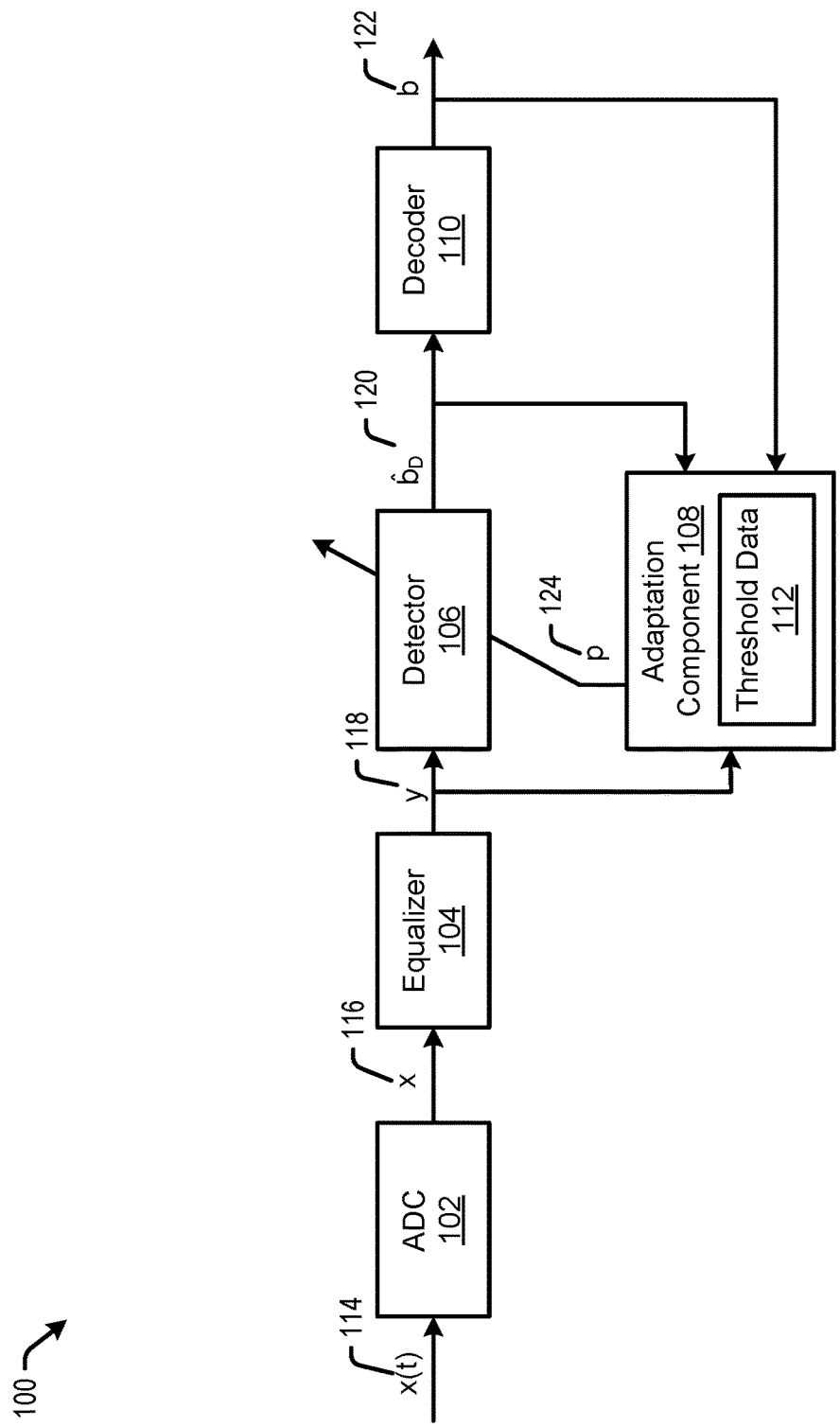
FIG. 1 is a block diagram of a communication channel which includes multi-threshold parameter adaptation, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally relates to parameter adaptation, and in some embodiments, the present disclosure may relate to multi-threshold parameter adaptation which may determine an error metric for one or more samples, determine whether the error metric is within one of a plurality of thresholds and, if so, apply a weight corresponding to the determined threshold to the parameter update.

Some systems, such as electrical, electronic, motor drive, processing, or other systems may receive a signal of interest and process that signal based on parameters. For example, a read channel of a communication system or a magnetic recording storage system may utilize adaptive parameters to process an input signal. In some systems, a detector may generate a data sequence based on an equalized sample sequence and adaptive parameters. An adaptation component may include various adaptive functions or algorithms for adapting the parameters of the detector. For example, the adaptive parameters may be coefficients or taps of the filter circuits of a soft-output Viterbi algorithm (SOVA) detector (e.g. of finite impulse response filters (FIRs) or of data-dependent FIRs (DDFIRs) of the SOVA detector) or parameters such as branch variances or branch biases of a SOVA detector.

In some embodiments, a first weight may be used to adapt a set of adaptive parameters when an error metric is within a first threshold, a second weight may be used to adapt the set of adaptive parameters when the error metric is outside of the first threshold but within a second threshold (e.g. the first threshold is smaller than the second threshold). Some embodiments may include additional thresholds such that a third weight may be used to adapt the set of adaptive parameters when the error metric is outside of the first and second thresholds but within a third threshold (e.g. the first and second thresholds are smaller than the third threshold) and so on. In some embodiments, the weights scale the updates down as the error metric grows.

Taking Minimum Bit-Error Rate (MBER) adaptation as an example, while the algorithm without multi-threshold parameter adaptation may minimize the number of bit errors in the decoded data, it is slow to converge, as the algorithm may only update the detector parameters when an error event, or near error event occurs (e.g. when the difference metric (e.g. error metric) has small magnitude). In practice, this may limit the number of updates to a small multiple (e.g. ~3×) of the bit error rate (BER), whereas, some least squares (LS) based adaptation algorithms may update the parameters based on every received sample. If, for example, the BER is around $10^{-3}$, then the MBER adaptation algorithm may be more than two orders of magnitude slower to adapt (e.g. from a given initial set of parameters, an MBER algorithm may take more than 100 times longer to converge to a steady state than an LS algorithm).

In manufacturing, slow adaptation may increase the time required to optimize read channel parameters and the increased manufacturing time may add cost. In operation in the field, slow adaptation may limit the speed at which the detector can adapt to transients, such as off-track reads, increasing the recovery and drive response time.

In embodiments disclosed herein, multi-threshold parameter adaptation may be utilized with the MBER algorithm which may improve the rate of adaptation and convergence. The MBER algorithm is described in U.S. Patent Application Publication 2011/0075569, "OBTAINING PARAMETERS FOR MINIMIZING AN ERROR EVENT PROBABILITY," the entire disclosure of which, except for any definitions, disclaimers, disavowals, and inconsistencies, is incorporated herein by reference.

In some embodiments, the MBER algorithm may adapt detector parameters (e.g. Viterbi/SOVA/FIR detector parameters) to minimize the bit error rate (e.g. the hamming weighted error event rate) by considering error events on the trellis of the Viterbi or SOVA detector. The detector trellis may be a collection of detector states, unrolled in time with allowed state transitions indicated by branches spanning pairs of states.

A given bit sequence may correspond to a single path through the detector trellis. A particular path of interest may be the genie or correct path which may correspond to the written data being read. If the detector selects a path that deviates from this the correct path (e.g. an error event), one or more bit errors occur. The MBER adaptation may move the detector parameters to minimize the frequency and length of error events.

For each state, a Viterbi or SOVA detector may consider incoming paths. For each path, the detector may compute a path metric representing the probability of occurrence of that path for the observed samples. The branches in the path may be considered conditionally independent, thus the path metric may be computed by summing the log-domain branch probabilities (branch metrics). For example, the branch metric for a path may be determined using the following equation:

$$M_i(b) = \sum_{j=1}^{l} (y_j - y_{b_j})^2$$

where i may be a time index or state, l may be a length of the path in the detector trellis (e.g. number of branches), b may be a set of branches in the path, $y_j$ may be the jth sample and $y_{b_j}$ may be the expected sample for a given branch $b_j$. In the equation above, negative log-probabilities may be used as the branch metrics. In some embodiments using the equation above, the sample $y_j$ may be common to all branches for that sample period of the trellis, but embodiments are not so limited and the sample $y_j$ may differ if branch/data dependent filters (FIRs) are used in the detector.

The difference between two path metrics of the incoming paths to a state or time index may be called the difference metric or error metric. For example, the difference metric or error metric may be determined using the following equation:

$$\Delta_i \triangleq M_i(b_1) - M_i(b_2) \triangleq (y_{i-2} - y_{b_1})^2 + (y_{i-1} - y_{b_2})^2 + (y_i - y_{b_3})^2 - (y_{i-2} - y_{b_4})^2 - (y_{i-1} - y_{b_5})^2 - (y_i - y_{b_6})^2$$

where i may be the current state or time index, the length of the path in the detector trellis may be three (3) branches, $y_{i-2}$, $y_{i-1}$, and $y_i$ may be the samples corresponding to the current state, $b_1$ may be the path including branches $y_{b_1}$, $y_{b_2}$, and $y_{b_3}$ and $b_2$ may be the path including branches $y_{b_4}$, $y_{b_5}$, and $y_{b_6}$. The sign of the difference metric may determine the most likely path into that state and hence the decision that the detector may make. Using the sign convention, when the difference metric $\Delta_i$ of the genie or correct path metric minus the contender path metric is positive, an error event may be said to have occurred and thus bit errors. Similarly, if the difference metric of the genie path minus a contender path is near zero (e.g. $\Delta_i \approx 0$), a near error may be said to have occurred.

In some embodiments according to this disclosure, the bit error rate (BER) may be approximated as:

$$BER \approx E_i[U(-\Delta_i) \times W_H(\text{error event associated with } \Delta_i)]$$

where $$U(x) = \begin{cases} 1 & \text{if } x > 0 \\ 0 & \text{otherwise} \end{cases}$$

$W_H(\mathcal{E})$ = hamming weight of error event $\mathcal{E}$

The detector parameters may be adapted to reduce the BER by considering the gradient of this expression for the approximate BER with respect to each parameter. In particular, a stochastic gradient may be formed by taking the partial derivative of the BER equation set forth above. Ignoring the averaging or expectation $E_i$, the stochastic gradient for the Viterbi/SOVA bias parameter $\hat{y}_{b_j}$ may be expressed as:

$$\frac{\partial(BER)}{\partial \hat{y}_{b_j}} = \frac{\partial(U(-\Delta_i))}{\partial \hat{y}_{b_j}} \times W_H(\text{error event associated with } \Delta_i)$$

$$= -\mathcal{I}(\Delta_i) \times \frac{\partial(\Delta_i)}{\partial \hat{y}_{b_j}} \times W_H(\text{error event associated with } \Delta_i)$$

where $\mathcal{I}(x) = \begin{cases} 1 & \text{if } x = 0 \\ 0 & \text{otherwise} \end{cases}$ As can be seen from above equation, the stochastic gradient for the parameters may involve the delta function, $I(\Delta_i)$, which may be non-zero if and only if $\Delta_i = 0$. When the received samples are represented using real numbers, the probability of occurrence of this may be approximately zero (0). Further, even in finite precision embodiments, the probability of occurrence may be very small. As such, in either case, systems that directly use the delta function above may have very few error events which have non-zero gradients (e.g. gradients that contribute to the update/adaptation of the parameters). In practice, the limited number of error events with non-zero gradients may case adaption to be very slow.

The delta function may be modified to allow error events with difference metrics near zero to also contribute to the gradient as shown in the following equation:

$$I(x) = \begin{cases} 1 & \text{if } |x| < \alpha \\ 0 & \text{otherwise} \end{cases}$$

where a is a control parameter. However, while the introduction of the control parameter, a, may increase the adaptation rate, such systems suffer the negative consequence of worsening the approximation of the gradient to that which minimizes the BER. In other words, as a is increased, the instability in the MBER stochastic gradient algorithm may increase, particularly in the presence of large adaption update latencies (e.g. when LDPC decoding of data is required) as error events (or near error events) with large difference metrics tend to be associated with greater update magnitudes which may increase the variance of the parameters during adaptation.

In some embodiments according to this disclosure, a multi-threshold delta function, AA), may be utilized which may allow for increased adaptation rates without the negative consequences that may be introduced by increasing a as noted above. In particular, the multi-threshold delta function, $I(\Delta_i)$, may include multiple regions in the thresholding function, each region having a threshold and an associated weighting for a parameter update from a difference metric $\Delta_i$ in that region. Such a multi-threshold delta function, $I(\Delta_i)$ may be expressed as shown in the following equation:

$$I(x) = \begin{cases} w_1 & \text{if } |x| < \alpha_1 \\ w_2 & \text{if } \alpha_1 <= |x| < \alpha_2 \\ \cdots \\ w_n & \text{if } \alpha_{n-1} <= |x| < \alpha_n \\ 0 & \text{otherwise} \end{cases}$$

where $\alpha_1, \alpha_2, \ldots,$ and $\alpha_n$ may be thresholds and $w_1, w_2, \ldots,$ and $w_n$ may be corresponding weights that may be used to modify the MBER parameter update (e.g. to reduce or increase the influence of error events based on the region the difference metric falls into). In some embodiments, the use of a multi-threshold delta function, AA), may adapt twice as fast or more than a single threshold system without a significant increase in instability.

In some embodiments, the thresholds $\alpha_i$ may increase with i while the corresponding weights $w_i$ may decrease with i. However, embodiments are not so limited. For example, in some embodiments, the thresholds may be different for positive or negative $\Delta_i$ may be different instead of using the absolute value, the thresholds $\alpha_i$ or weights $w_i$ may not increase or decrease with each i, and so on. Further, in some embodiments, continuous valued approximations may also be used such that the weights $w_i$ may be determined as a function of the difference metric. Further, the thresholds may be determined at manufacturing and stored for use during normal operation. In other embodiments, the thresholds may be adapted during use. In the case of a hard disc drive or other devices whose parameters vary across the medium, the thresholds and weights may be generated for each storage unit (e.g. sectors, pages, etc.) or for larger regions or zones that may corresponding to groups of tracks (which is the case in the example discussed below).

While examples discussed herein relate to embodiments utilizing Minimum Bit-Error Rate (MBER) adaptation, the systems and techniques disclosed herein may be utilized with various other adaptation algorithms. Other examples of types of adaptation algorithms may include minimum mean squared error (MMSE) adaptation, least mean square adaptation, recursive least squares (RLS) adaptation, and similar adaptation algorithms.

An example of such a system is discussed below with regard to FIG. 1.

Referring to FIG. 1, a block diagram of a communication channel which includes multi-threshold parameter adaptation is shown and is generally designated 100. System 100 can include an analog-to-digital converter (ADC) 102 that may be coupled to an equalizer 104. The equalizer 104 may be coupled to a detector 106 and an adaptation component 108. The detector 106 may be coupled to a decoder 110 and the adaptation component 108. The adaptation component 108 may be connected to the detector 106. In addition, the decoder 110 may include an output from the communication channel 100 and be connected to the adaptation component 108. The adaptation component 108 may include a memory for storing threshold data 112 or access threshold data 112 stored in a separate memory (not shown).

Each of the ADC 102, equalizer 104, detector 106, adaptation component 108, and decoder 110 may be a separate circuit, a system on chip (SOC), firmware, a processor(s), or other system not listed, or any combination thereof.

As discussed in detail below, in the embodiment illustrated in FIG. 1, the parameters that are adapted are the parameters of the detector 106. While the discussion herein utilizes parameters of a detector of a read channel as examples, the disclosed techniques and systems may apply to other circuits or parameters. Many variations would be apparent to one of ordinary skill in the art in view of this disclosure.

In operation, the ADC 102 may sample a continuous-time signal x(t) 114 at regular intervals and may quantize the signal to produce a digitized sequence of samples x 116.

The equalizer 104 may receive the digitized sequence of samples x 116 and generate an equalized sample sequence y 118. In some examples, the equalizer may operate to shorten the intersymbol interference (ISI) length, or memory, of a channel. Further, the equalizer 102 may act to absorb variations in the input signal or noise statistics that may occur over time. In general, the equalizer 104 may produce a consistent, known, input signal to the detector 106 such that the detector 106 may estimate the data sequence corresponding to the signal x(t) 114 based on coefficients or parameters p 124 provided by the adaptation component 108.

The detector 106 may operate to determine (or estimate) a data sequence $\hat{b}_D$ 120 of bit values corresponding to the signal x(t) 114 based on the equalized sample sequence y 118 and the parameters or coefficients p 124 provided by the adaptation component 108. Specifically, the parameters p 124 may be provided to the detector to be used for estimation of the data sequence $\hat{b}_D$ 120. The data sequence $\hat{b}_D$ 120 may be representative of the probability that each bit is a zero or one. The values 124 may be represented as logs of the ratios of these probabilities and may be referred to as log likelihood ratios or LLRs. The detector 106 may act to generate the LLRs values based on knowledge of a channel response (e.g. the expected channel output for each possible written/transmitted data pattern). In some examples, the detector 108 may employ a Soft-Output Viterbi Algorithm (SOVA).

The generated data sequence $\hat{b}_D$ 120 may be passed to the decoder 110 which may generate decoded data b 122 if the data sequence $\hat{b}_D$ 120 is successfully decoded or extrinsic information or EXT (not shown) which may be representative of the probability that each bit is a zero or one. The decoder 110 may generate the decoded data b 122 or the EXT based on a structure of a utilized code. Though not shown for ease of illustration, in some implementations, the EXT may be returned to the detector (e.g. for use as part in an iterative decoding process being performed by the detector 106 and decoder 110).

The adaptation component 108 may operate to receive the equalized sample sequence y 118, the data sequence $b_D$ 120 and the decoded data b 122 and adapt the parameters 124 of the detector 106.

More particularly, the detector 106 may be a SOVA detector. In some embodiments, the parameters 124 of the SOVA detector may be adapted using multi-threshold Minimum Bit-Error Rate (MBER) adaptation. More particularly, MBER adaptation of the SOVA detector parameters may be run on sectors which the decoder 110 can correctly decode the written data (e.g. thereby re-producing the written data and providing b 122 to the adaptation component). The decoded data b 122 may be fed back to the MBER adaptation together with the stored equalized sample sequence y 118 (or a subset of them).

More particularly, difference metrics (e.g. error metric) $\Delta_i$ may be determined between the decoded data, the stored equalized sample sequence y 118 and contender paths. The difference metric may then be utilized with the multi-threshold delta function, AA)), to determine the adaptive MBER parameters may be updated based on the current data sequence. This determination may be made as discussed above using threshold data 112. The threshold data 112 may be generated during manufacturing or during a training process in the field. In the case of a hard disc drive or other devices whose parameters vary across the medium, the threshold data 112 may be generated for each storage unit (e.g. sectors, pages, etc.) or for larger regions or zones that may corresponding to groups of tracks (which is the case in the example discussed below). During generation of the threshold data, MBER parameter sets may be generated using known write data. The threshold data may then be adapted based on adaptation rate and stability metrics.

Figure 2:
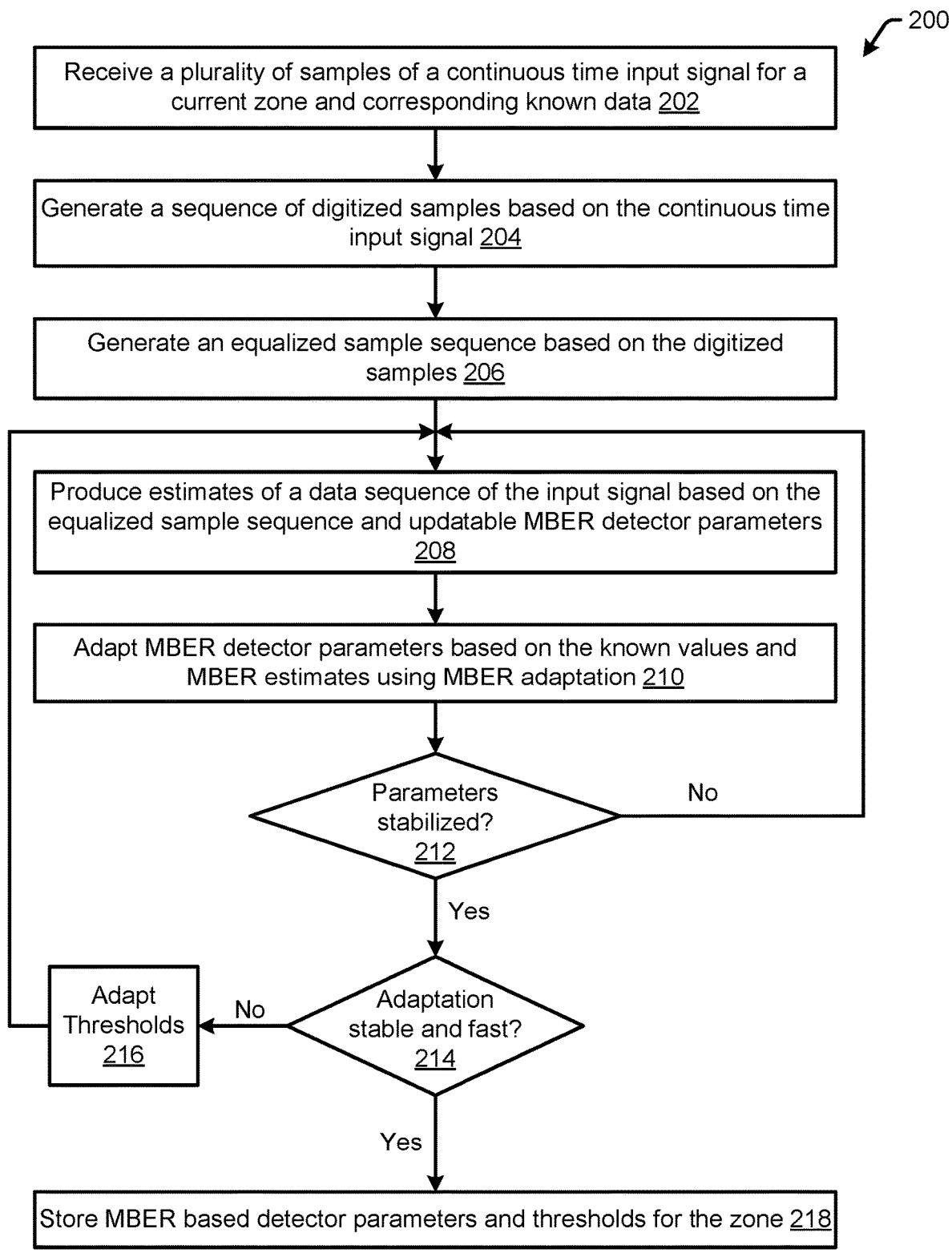
FIG. 2 is a flowchart of a method of multi-threshold parameter adaptation, in accordance with certain embodiments of the present disclosure.

Referring to FIG. 2, a flowchart of a method of multi-threshold parameter adaptation is shown and is generally designated 200. More particularly, flowchart 200 may be manufacturing or training operations to generate the threshold data 112 detailed above with respect to FIG. 1 for a current zone.

The system may receive a plurality of samples of a continuous time input signal for a current zone along with corresponding known data at 202. The system may then generate a sequence of digitized samples based on the continuous time input signal at 204. At 206, the system may generate an equalized sample sequence based on the digitized samples.

Next, the system may produce MBER based estimates of a data sequence of the input signal based on the equalized sample sequence and updatable MBER detector parameters at 208. In some embodiments, the decoder may perform decoding operations for one or more of the MBER based estimates. At 210, the system may perform a multi-threshold MBER based adaptation process on the MBER detector parameters based on the known values (e.g. predetermined data or decoded read data) and MBER estimates.

The system may then determine if the MBER detector parameters have stabilized at 212. If the parameters have not stabilized, the system may return to 208 for additional adaptation operations. If the parameters have stabilized, at 214, the system may then determine if the adaptation process was stable and the adaptation rate was high enough for the current plurality of thresholds utilized in the multi-threshold MBER adaptation (e.g. based on a previously defined goal or metric). If not, the system may adapt the thresholds and weights and return to 208. If the adaptation was stable and fast enough, the system may store MBER based detector parameters and a plurality of thresholds for the current zone (e.g. as threshold data 112). Though not shown, in some embodiments, additional operations, such as one or more of operations 202-206 may also be repeated when the parameters have not stabilized or the stability determination may be may be performed for new samples until the parameters have stabilized for general data samples of the zone.

Figure 3:
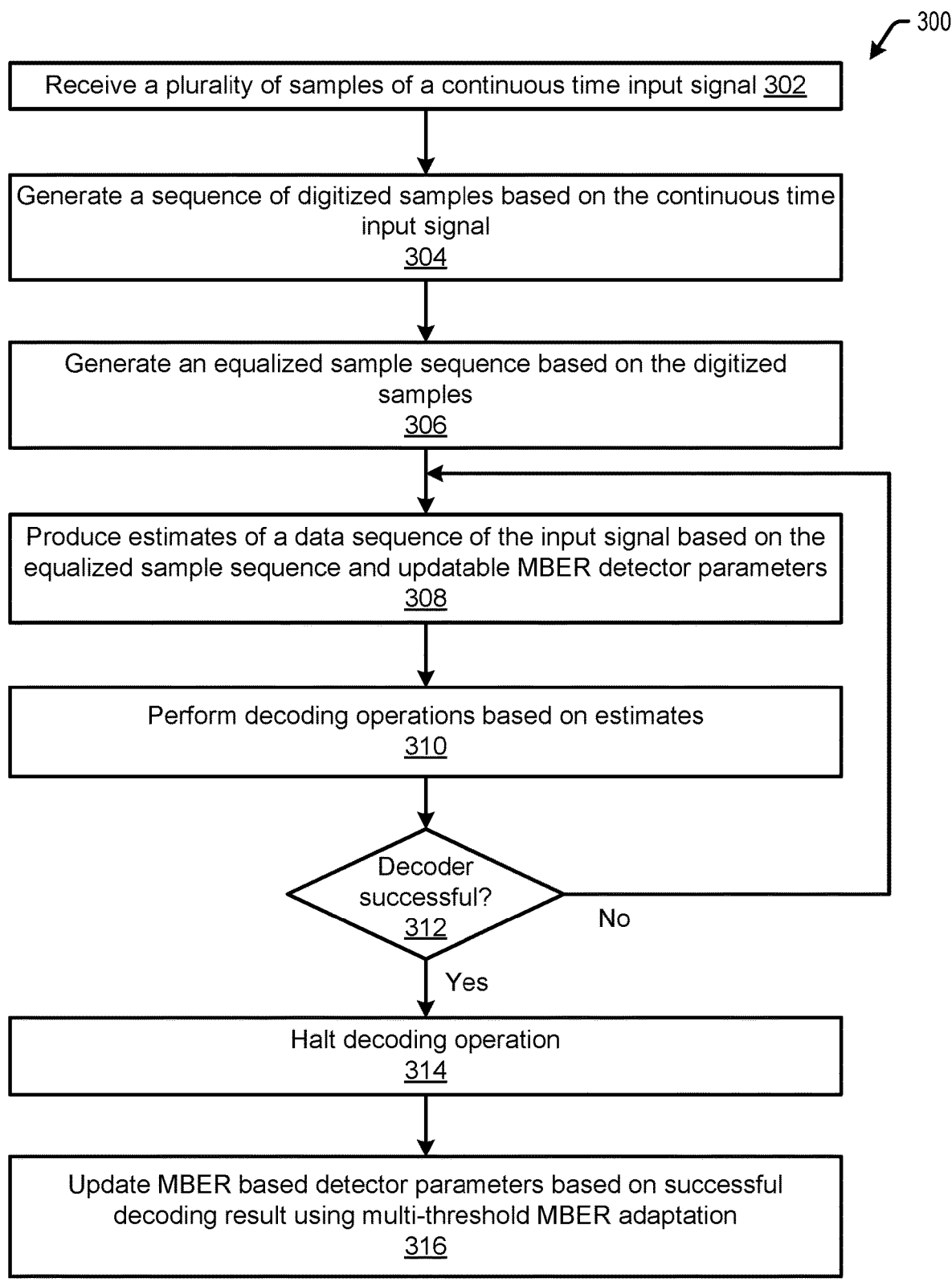
FIG. 3 is a flowchart of a method of multi-threshold parameter adaptation, in accordance with certain embodiments of the present disclosure.

Referring to FIG. 3, a flowchart of a method of multi-threshold parameter adaptation is shown and is generally designated 300. More particularly, flowchart 300 may perform detection, decoding and parameter adaptation during a read or receive operation and may be performed as detailed above.

In operation, at 302, the system may receive a plurality of samples of a continuous time input signal, for example, for a current data sector. At 304, the system may generate a sequence of digitized samples based on the continuous time input signal, for example, using an ADC. Next, the system may generate an equalized sample sequence based on the digitized samples at 306.

At 308, the system may produce estimates of a data sequence of the input signal based on the equalized sample sequence and updatable MBER detector parameter, for example, using a SOVA detector. Decoding operation may then be performed on the detector estimates at 310, for example, using a LDPC decoder.

At 312, the system may determine whether the decoder was successful. If not, the system may return to 308 for an additional detection and decoding attempt. If so, the system may halt the operations for the current sector, output the decoded data sequence. Then, at 316, the system may update the MBER based detector parameters based on the successful decoded data sequence using multi-threshold MBER adaptation as discussed above.

All steps listed for the methods 200 and 300 may be applied to systems that have adaptive parameters. As mentioned above, other adaptation algorithms could be substituted for MBER and these processes may be utilized for parameters of other circuits such as decoders, equalizers, ADCs and so on. Many other variations would be apparent in view of this disclosure. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

Figure 4:
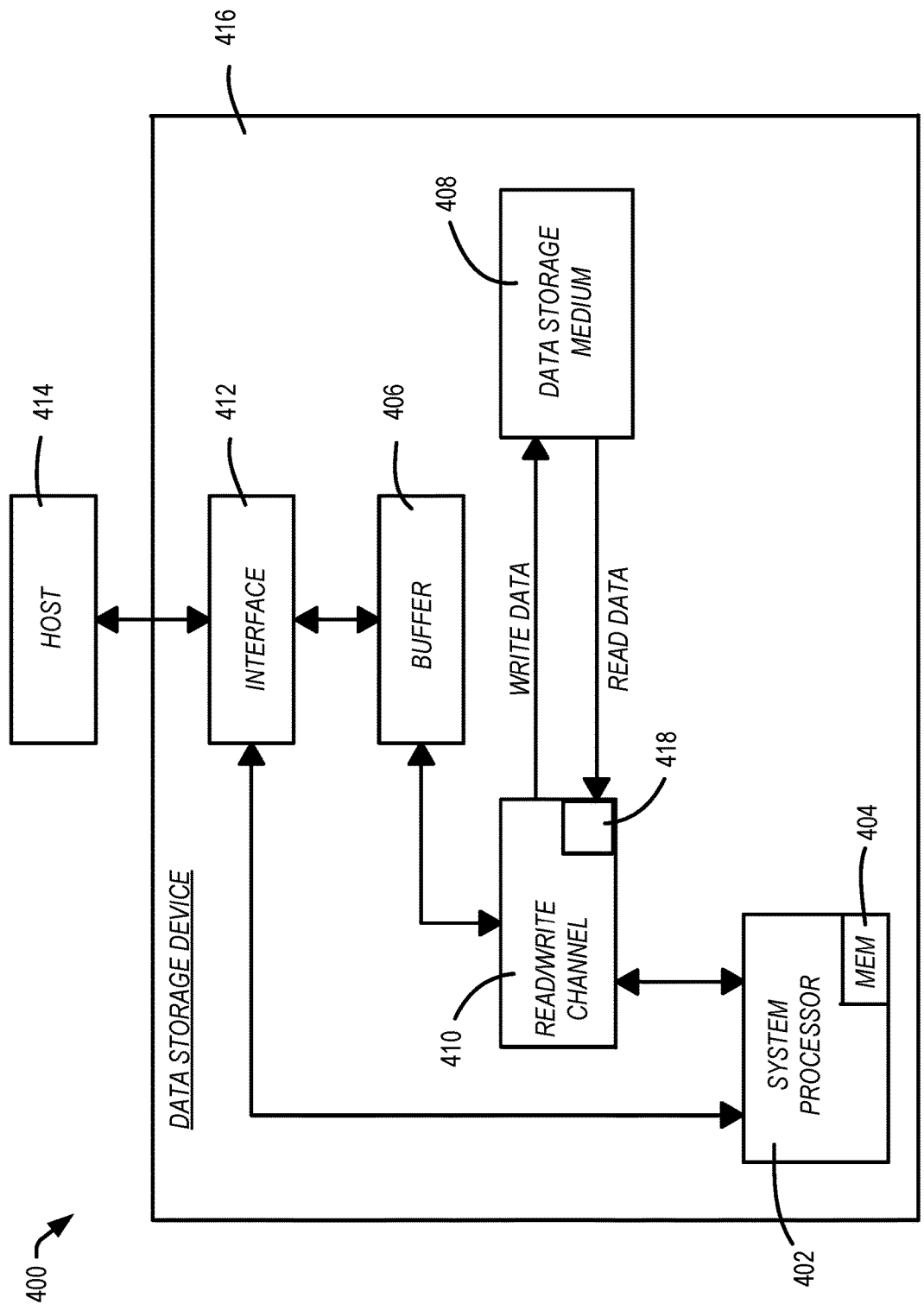
FIG. 4 is a block diagram of a system including multi-threshold parameter adaptation, in accordance with certain embodiments of the present disclosure.

Referring to FIG. 4, a block diagram of a system including multi-threshold parameter adaptation is shown and generally designated 400. The system 400 can be an example of a data storage device (DSD), and may be an example implementation of system 100. The DSD 416 can optionally connect to and be removable from a host device 414, which can be a device or system having stored data, such as a desktop computer, a laptop computer, a server, a digital video recorder, a photocopier, a telephone, a music player, other electronic devices or systems not listed, or any combination thereof. The data storage device 416 can communicate with the host device 414 via the hardware/firmware based host interface circuit 412 that may include a connector (not shown) that allows the DSD 416 to be physically connected and disconnected from the host 414.

The DSD 416 can include a system processor 402, which may be a programmable controller, and associated memory 404. The system processor 402 may be part of a system on chip (SOC). A buffer 406 may temporarily store data during read and write operations and can include a command queue. The read/write (R/W) channel 410 can encode data during write operations to, and reconstruct data during read operations from, the data storage medium 408. The data storage medium 408 is shown and described as a hard disc drive, but may be other types of magnetic medium, such as a flash medium, optical medium, or other medium, or any combination thereof.

The R/W channel 410 may receive data from more than one data storage medium at a time, and in some embodiments can also receive multiple data signals concurrently, such as from more than one output of a read head. For example, storage systems having two-dimensional magnetic recording (TDMR) systems can have multiple reading or recording elements, and can read from two tracks simultaneously or nearly simultaneously. Multi-dimensional recording (MDR) systems can receive two or more inputs from multiple sources (e.g. recording heads, flash memory, optical memory, and so forth). The R/W channel 410 can combine multiple inputs and provide a single output, as described in examples herein.

The block 418 can implement all of or part of the systems and functionality of systems and methods 100, 200, and 300. In some embodiments, the block 418 may be a separate circuit, integrated into the R/W channel 410, included in a system on chip, firmware, software, or any combination thereof.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a circuit configured to:
      receive an input signal at an input of a detector;
      process the input signal via the detector using a set of channel parameters;
      determine an error metric for the processing of the input signal using the set of channel parameters;
      compare the error metric to a plurality of thresholds; and
      when the error metric matches one of the plurality of thresholds, adapt, using an adaptation algorithm, the set of channel parameters to produce an updated set of channel parameters for use by the detector as the set of channel parameters in subsequent processing of the input signal, the adaptation of the set of channel parameters being based on a weight corresponding to a matching threshold of the plurality of thresholds.

2. The apparatus of claim 1, further comprising the detector being a Soft-Output Viterbi Algorithm (SOVA) detector and the set of channel parameters being branch biases of the SOVA detector.

3. The apparatus of claim 1, further comprising the adaptation algorithm being a multi-threshold Minimum Bit-Error Rate (MBER) adaptation algorithm.

4. The apparatus of claim 1, further comprising a memory storing the plurality of thresholds.

5. The apparatus of claim 1 further comprising the circuit further including:
   the detector configured to provide one or more detection results to a decoder; and
   the circuit further configured to:
      determine that a decoding of the one or more detection results by the decoder has succeeded; and
      at least partly in response to the determining the decoding has succeeded, perform the adapting, using the adaptation algorithm, of the set of channel parameters using a successful decoding result.

6. The apparatus of claim 5, further comprising the circuit configured to:
   determine the error metric based on a sequence of samples in the input signal, a first sequence of corresponding expected samples based on the successful decoding result, and a second sequence of corresponding expected samples for a contender detection result.

7. The apparatus of claim 1, further comprising the circuit further configured to:
   when the error metric does not match one of the plurality of thresholds, prevent the update of the set of channel parameters for a sequence of samples corresponding to the error metric.

8. The apparatus of claim 1, further comprising:
   the input signal based on a readback signal read from a sector of a magnetic storage medium; and
   the plurality of thresholds corresponding to an area of the magnetic storage medium including the sector and being generated during a manufacturing process including reading back known data written to the area of the magnetic storage medium including the sector.

9. A system comprising:
   a channel detector circuit having an input configured to receive an input signal;
   the channel detector circuit configured to process the input signal using a set of parameters;
   an adaptation circuit configured to:
      determine an error metric for the processing of the input signal using the set of parameters;

compare the error metric to a plurality of thresholds; and when the error metric matches one of the plurality of thresholds, adapt, using an adaptation algorithm, the set of parameters to produce an updated set of parameters for use by the channel detector circuit as the set of parameters in subsequent processing of the input signal, the adaptation of the set of parameters being based on a weight corresponding to a matching threshold of the plurality of thresholds.

10. The system of claim 9 further comprising the channel detector circuit being a Soft-Output Viterbi Algorithm (SOVA) detector and the set of parameters being branch biases of the SOVA detector.

11. The system of claim 10 further comprising the adaptation algorithm being a multi-threshold Minimum Bit-Error Rate (MBER) adaptation algorithm.

12. The system of claim 10 further comprising a memory storing the plurality of thresholds.

13. The system of claim 9 further comprising:
the input signal being based on a readback signal read from a sector of a magnetic storage medium;
an ADC circuit configured to generate one or more analog-to-digital converter (ADC) samples based on the readback signal;
an equalizer circuit configured to receive the one or more ADC samples and to equalize the one or more ADC samples to generate a digitized sample sequence;
the channel detector circuit configured to perform the processing of the input signal using the digitized sample sequence and the set of parameters to produce one or more detection results; and
a decoder configured to receive the one or more detection results and to perform decoding on the one or more detection results to produce one or more decoding results; and
the adaptation circuit further configured to:
determine that a decoding of the one or more detection results produced by the channel detector circuit using the set of parameters has succeeded; and
at least partly in response to the determining the decoding has succeeded, perform the adapting, using the adaptation algorithm, of the set of parameters using one or more successful decoding results.

14. The system of claim 9 further comprising the adaptation circuit being further configured to determine the error metric based on a sequence of samples in the input signal, a first sequence of corresponding expected samples based on a successful decoding result, and a second sequence of corresponding expected samples for a contender detection result.

15. The system of claim 9 further comprising:
the input signal being based on a readback signal read from a sector of a magnetic storage medium; and
the plurality of thresholds corresponding to an area of the magnetic storage medium including the sector and being generated during a manufacturing process including reading back known data written to the area of the magnetic storage medium including the sector.

16. A method comprising:
receiving, at an input of a data channel detector circuit, an input signal;
processing, by the data channel detector circuit, the input signal using a set of channel parameters;
determining, by the data channel detector circuit, an error metric for the processing of the input signal using the set of channel parameters;
comparing, by the data channel detector circuit, the error metric to a plurality of thresholds; and
when the error metric matches one of the plurality of thresholds, adapting, by the data channel detector circuit using an adaptation algorithm, the set of channel parameters to produce an updated set of channel parameters for use by the data channel detector circuit as the set of channel parameters in subsequent processing of the input signal, the adaptation of the set of channel parameters being based on a weight corresponding to a matching threshold of the plurality of thresholds.

17. The method of claim 16 further comprising the data channel detector circuit including a Soft-Output Viterbi Algorithm (SOVA) detector that uses the set of channel parameters as branch biases of the SOVA detector to perform the processing of the input signal.

18. The method of claim 17 further comprising the adaptation algorithm being a multi-threshold Minimum Bit-Error Rate (MBER) adaptation algorithm.

19. The method of claim 16 further comprising:
determining the error metric based on a sequence of samples in the input signal, a first sequence of corresponding expected samples based on a successful decoding result, and a second sequence of corresponding expected samples for a contender detection result.

* * * * *